United States Patent
Stuber

(10) Patent No.: US 9,786,613 B2
(45) Date of Patent: Oct. 10, 2017

(54) EMI SHIELD FOR HIGH FREQUENCY LAYER TRANSFERRED DEVICES

(71) Applicant: QUALCOMM Incorporated, San Diego, CA (US)

(72) Inventor: Michael A. Stuber, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 76 days.

(21) Appl. No.: 14/454,204

(22) Filed: Aug. 7, 2014

(65) Prior Publication Data

US 2016/0043044 A1    Feb. 11, 2016

(51) Int. Cl.
*H01L 23/48* (2006.01)
*H01L 21/768* (2006.01)
(Continued)

(52) U.S. Cl.
CPC .......... *H01L 23/60* (2013.01); *H01L 21/6835* (2013.01); *H01L 21/76838* (2013.01);
(Continued)

(58) Field of Classification Search
CPC ......... H01L 21/30; H01L 21/46; H01L 27/12; H01L 21/76251; H01L 21/76254;
(Continued)

(56) References Cited

U.S. PATENT DOCUMENTS 5,306,942 A    4/1994    Fujii
5,898,198 A *  4/1999    Herbert ................. H01L 23/552
                                                              257/319
(Continued)

FOREIGN PATENT DOCUMENTS

EP          0567694 A1    11/1993

OTHER PUBLICATIONS

Wu et al., A High Aspect-Ratio Silicon Substrate-Via Technology and Applications: Through-Wafer Interconnects for Power and Ground and Faraday Cages for SOC Isolation, IEEE IEMD, Dec. 2000.

(Continued)

*Primary Examiner* — Marcos D Pizarro
*Assistant Examiner* — Nelson Garces
(74) *Attorney, Agent, or Firm* — Seyfarth Shaw LLP

(57) ABSTRACT

Various methods and devices that involve EMI shields for radio frequency layer transferred devices are disclosed. One method comprises forming a radio frequency field effect transistor in an active layer of a semiconductor on insulator wafer. The semiconductor on insulator wafer has a buried insulator side and an active layer side. The method further comprises bonding a second wafer to the active layer side of the semiconductor on insulator wafer. The method further comprises forming a shield layer for the semiconductor device. The shield layer comprises an electrically conductive material. The method further comprises coupling the radio frequency field effect transistor to a circuit comprising a radio frequency component. The method further comprises singulating the radio frequency field effect transistor, radio frequency component, and the shield layer into a die. The shield layer is located between a substrate of the radio frequency component and the radio frequency field effect transistor.

11 Claims, 10 Drawing Sheets

(51) Int. Cl.
   *H01L 23/60* (2006.01)
   *H01L 21/84* (2006.01)
   *H01L 23/552* (2006.01)
   *H01L 21/683* (2006.01)

(52) U.S. Cl.
   CPC ............ *H01L 21/84* (2013.01); *H01L 23/552* (2013.01); *H01L 2221/6834* (2013.01); *H01L 2221/68327* (2013.01); *H01L 2924/0002* (2013.01); *H01L 2924/1306* (2013.01); *H01L 2924/14* (2013.01); *H01L 2924/1421* (2013.01); *H01L 2924/1461* (2013.01)

(58) Field of Classification Search
   CPC . H01L 27/1214; H01L 23/60; H01L 21/6835; H01L 23/552; H01L 21/76838; H01L 21/84; H01L 2924/0002; H01L 2221/68327; H01L 2221/6834; H01L 2924/1461; H01L 2924/14; H01L 2924/1306; H01L 2924/1421
   USPC .................................................. 257/523–533
   See application file for complete search history.

(56) References Cited

U.S. PATENT DOCUMENTS

| | | |
|---|---|---|
| 6,310,386 B1 | 10/2001 | Shenoy |
| 6,465,280 B1 | 10/2002 | Martin et al. |
| 6,465,892 B1 | 10/2002 | Suga |
| 6,473,314 B1 | 10/2002 | Custer et al. |
| 6,597,053 B1 | 7/2003 | Anthofer |
| 6,844,613 B2 | 1/2005 | Shimizu |
| 7,067,909 B2 | 6/2006 | Reif et al. |
| 7,208,729 B2 | 4/2007 | Syms |
| 7,307,003 B2 | 12/2007 | Reif et al. |
| 7,446,017 B2 | 11/2008 | Liu et al. |
| 7,449,767 B2 | 11/2008 | Cohen et al. |
| 7,727,806 B2 | 6/2010 | Uhland et al. |
| 7,795,709 B2 | 9/2010 | Degani et al. |
| 7,887,377 B1 | 2/2011 | Wallace |
| 8,048,766 B2 | 11/2011 | Joly et al. |
| 8,129,266 B2 | 3/2012 | Dalal et al. |
| 8,212,331 B1 | 7/2012 | Kar-Roy et al. |
| 8,273,610 B2 | 9/2012 | Or-Bach et al. |
| 8,362,599 B2 | 1/2013 | Kim et al. |
| 8,395,242 B2 | 3/2013 | Oliver et al. |
| 8,432,007 B2 | 4/2013 | Leidl et al. |
| 8,536,685 B2 | 9/2013 | Dalal et al. |
| 8,645,898 B2 | 2/2014 | Ding et al. |
| 8,648,454 B2 | 2/2014 | Liu et al. |
| 8,686,543 B2 | 4/2014 | Bergemont et al. |
| 8,743,553 B2 | 6/2014 | Giuliano |
| 2002/0072163 A1 | 6/2002 | Wong et al. |
| 2002/0155655 A1 | 10/2002 | Pon |
| 2003/0197243 A1 | 10/2003 | Beng et al. |
| 2005/0139954 A1 | 6/2005 | Pyo |
| 2005/0275061 A1 | 12/2005 | Ohguro |
| 2006/0057836 A1* | 3/2006 | Nagarajan ......... H01L 21/76898 438/622 |
| 2006/0176211 A1* | 8/2006 | Mohamadi ............ G01S 13/765 342/51 |
| 2007/0246837 A1 | 10/2007 | Dong |
| 2007/0281438 A1 | 12/2007 | Liu et al. |
| 2010/0007444 A1 | 1/2010 | Nordin et al. |
| 2010/0078779 A1* | 4/2010 | Barth .................... H01L 23/552 257/659 |
| 2010/0244208 A1* | 9/2010 | Pagaila ................. H01L 21/568 257/659 |
| 2010/0295151 A1 | 11/2010 | Kurokawa |
| 2011/0073967 A1 | 3/2011 | Chen et al. |
| 2011/0128092 A1* | 6/2011 | Fritz ..................... H03H 9/706 333/133 |
| 2012/0161310 A1* | 6/2012 | Brindle ................. H01L 21/84 257/734 |
| 2013/0105950 A1 | 5/2013 | Bergemont et al. |
| 2014/0146501 A1* | 5/2014 | Thiel ................... H01L 23/5389 361/762 |
| 2014/0167197 A1 | 6/2014 | Jangjian et al. |

OTHER PUBLICATIONS

International Search Report and Written Opinion—PCT/US2015/043287—ISA/EPO—dated Oct. 23, 2015.

* cited by examiner

100

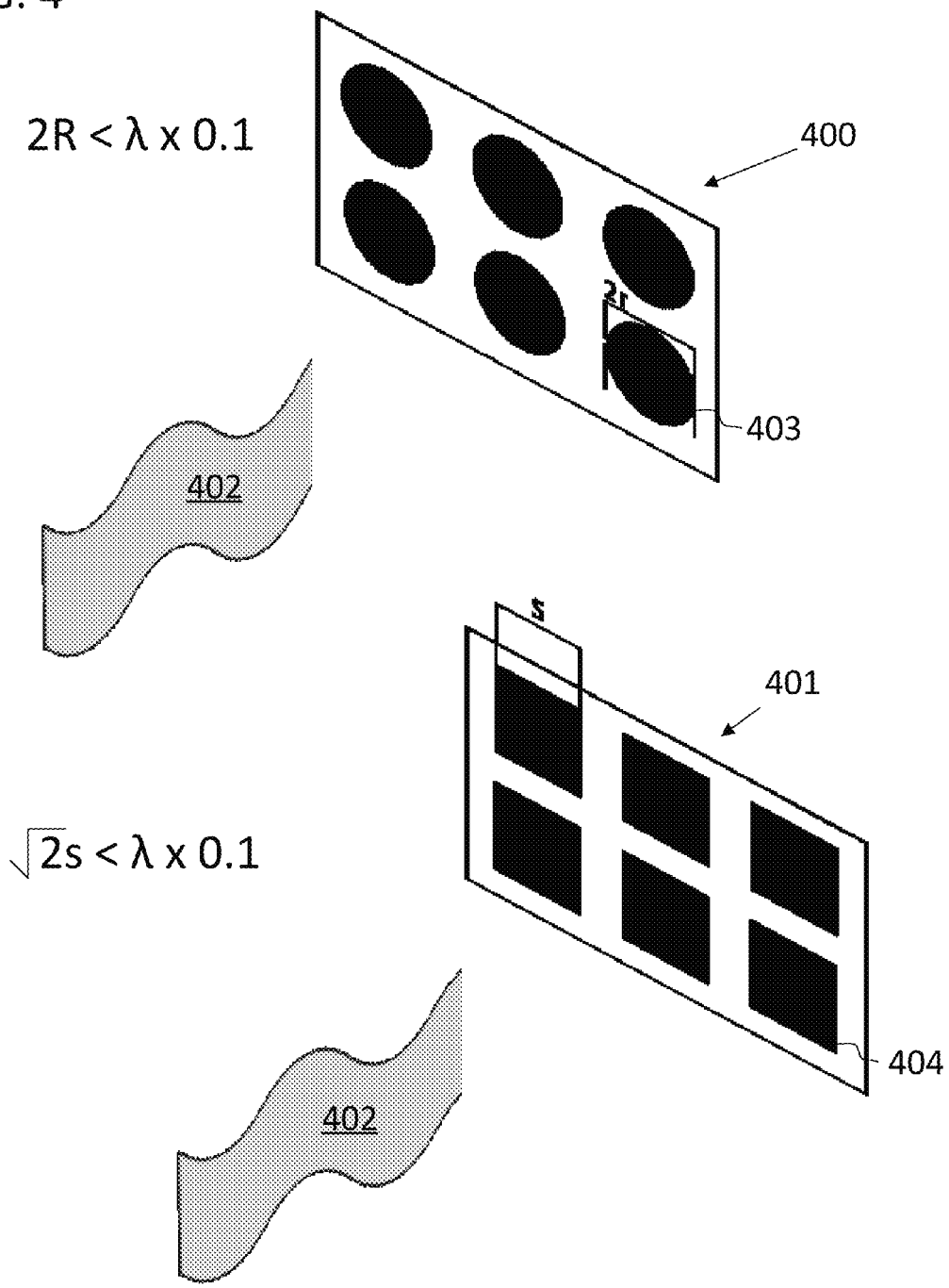

500

600

EMI SHIELD FOR HIGH FREQUENCY LAYER TRANSFERRED DEVICES

BACKGROUND OF THE INVENTION

Semiconductor-on-insulator (SOI) technology, which represents an advance over traditional bulk silicon processes, was first commercialized in the late 1990s. The defining characteristic of SOI technology is that the semiconductor region in which circuitry is formed is isolated from the bulk substrate by an electrically insulating layer. One advantage of isolating circuitry from the bulk substrate is a dramatic decrease in parasitic capacitance which allows access to a more desirable power-speed performance horizon. Therefore, SOI structures are particularly appealing for high frequency applications such as radio frequency (RF) communication circuits. As consumer demand continues to tighten the power constraints faced by RF communication circuits, SOI technology continues to grow in importance.

A typical SOI structure 100 is shown in FIG. 1. The SOI structure 100 includes a substrate layer 101, an insulator layer 102, and an active layer 103. The substrate layer 101 is typically a semiconductor material such as silicon. The insulator layer 102 is a dielectric which is often silicon dioxide formed through the oxidation of the substrate layer 101 in situations where the substrate layer 101 is silicon. The active layer 103 includes an active device layer and a metallization or metal interconnect layer, and further includes a combination of dopants, dielectrics, polysilicon, metal wiring, passivation, and other layers, materials or components that are present after circuitry has been formed therein. The circuitry may include metal wiring 104 (e.g. in the metal interconnect layer); passive devices such as resistors, capacitors, and inductors; and active devices such as a transistor (e.g. in the active device layer).

RF transistors operate on signals that are biased at large signal bias voltage and that vary from the bias voltage according to a signal voltage. Both values can swing dramatically. As a result, the switches produce electromagnetic noise 105 that propagates through the semiconductor device. In particular, the electromagnetic noise can interact with substrate 101 and result in nonlinear distortions in the signal voltage.

SUMMARY OF INVENTION

A disclosed method comprises forming a radio frequency field effect transistor in an active layer of a semiconductor on insulator wafer. The semiconductor on insulator wafer has a buried insulator side and an active layer side. The method further comprises bonding a second wafer to the active layer side of the semiconductor on insulator wafer. The method further comprises forming a shield layer for the semiconductor device. The shield layer comprises an electrically conductive material. The method further comprises coupling the radio frequency field effect transistor to a circuit comprising a radio frequency component. The method further comprises singulating the radio frequency field effect transistor, radio frequency component, and the shield layer into a die. The shield layer is located between a substrate of the radio frequency component and the radio frequency field effect transistor.

Another disclosed method comprises forming the radio frequency component in the second wafer prior to bonding the second wafer to the active layer of the semiconductor on insulator wafer. Another disclosed method comprises removing at least a portion of the substrate of the semiconductor on insulator wafer. The method also comprises forming the radio frequency component on the buried insulator side of the semiconductor on insulator wafer after removing the portion of the substrate. Another disclosed method comprises removing at least a portion of the substrate of the semiconductor on insulator wafer. The method also comprises bonding a third wafer to the buried insulator side of the semiconductor on insulator wafer after removing the portion of the substrate. The method also comprises forming the radio frequency component in the third wafer prior to bonding the third wafer to the active layer of the semiconductor on insulator wafer.

The shield layer can be a metal. The shield layer can have a pattern with a predetermined pore size. The pattern can be a mesh pattern. The pore size can be set to under 10% of the wavelength of signals the radio frequency field effect transistor is rated to process. The shield layer can be coupled to an active bias voltage generator. The active bias voltage generator can provide a bias voltage to the shield layer that tracks a large signal bias signal provided to the radio frequency field effect transistor.

The radio frequency component allows for tighter integration of a radio frequency system comprising the radio frequency field effect transistor and the radio frequency component. The radio frequency component can be an integrated passive device, acoustic filter, crystal filter, micro-electro-mechanical system (MEMS) generally, a block of other transistors such as a digital logic block, or any other radio frequency system component.

BRIEF DESCRIPTION OF THE DRAWINGS

FIG. 4 illustrates pore patterns in a shield layer and the relationship of pore size to the wavelength of electromagnetic interference the shield layer screens according to an embodiment of the present invention.

DETAILED DESCRIPTION OF THE EMBODIMENTS

Figure 1:
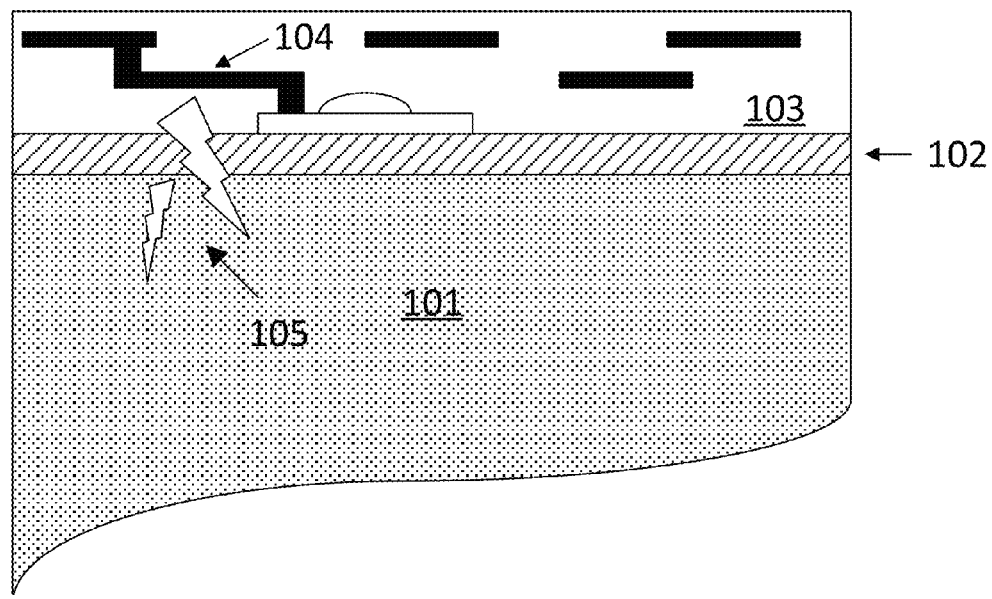
FIG. 1 illustrates a high frequency SOI device that is in accordance with the related art.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Radio frequency (RF) switches present a difficult integration challenge for modern integrated circuit design. In order for RF switches to perform adequately as signal processors in an RF system, it is necessary for the input and output voltages on each switch to maintain a linear relationship. Modern RF systems, and indeed nearly all modern communication systems, depend on both linear decoding and encoding systems as well as linear error reduction and noise cancellation systems. If nonlinearities are introduced anywhere in a signal path, the signal can be irreconcilably corrupted by noise or improper encoding and decoding. Unfortunately, many of the circuit components that could beneficially be integrated with RF switches from a cost perspective have the potential to deleteriously affect the linearity of the switches. RF components, such as integrated passive devices, acoustic filters, crystal filters, micro-electro-mechanical systems (MEMS) generally, and blocks of other transistors such as digital logic blocks, will often require, or will not be commercially feasible without, a semiconductor substrate. However, the interaction of the bias voltages and RF voltages on the RF switches with a semiconductor substrate creates a high likelihood of nonlinear distortion. It would therefore be beneficial to integrate any of the RF components mentioned above with an RF switch while shielding the RF switches from the semiconductor substrate of the RF component.

EMI Shielding of an Integrated RF Component

A layer of electrically conductive material that is placed between the RF switches and the semiconductor substrate can serve as an electromagnetic interference (EMI) shield layer that will prevent the bias voltages and RF voltages on the RF switches from interacting with the semiconductor substrate. Different methods and systems disclosed seek to provide such an EMI shield layer in an integrated circuit in which both an RF switch and another RF component are integrated in a single integrated circuit. These methods and systems therefore provide a way to integrate these otherwise conflicting elements in a cost effective manner while maintaining a desired level of performance for an RF circuit.

Methods for forming a semiconductor device can be described with reference to FIG. 2 and FIGS. 3a-b. Method 200 begins with step 201 where an RF field effect transistor (FET) is formed in an active layer 300 of a semiconductor on insulator (SOI) wafer 301. The SOI wafer has a buried insulator side 302 and an active layer side 303. The active layer side and buried layer side are defined by their relative location from the interface of the buried insulator 304 and active layer 300. The buried insulator side is in the direction of the buried insulator from the interface while the active layer side is in the direction of the active layer from the interface.

The RF FET can be formed in active layer 300 using standard transistor processing. For example, the RF FET can be produced using complementary metal-oxide-semiconductor (CMOS) processing. The semiconductor material that forms active layer 300 can be silicon. Buried insulator 304 can be silicon dioxide. SOI substrate 305 can be amorphous silicon. Alternatively, SOI substrate 305 and buried insulator 304 can be a single layer of aluminum oxide such that SOI wafer 301 is a silicon on sapphire (SOS) wafer. The substrate could also have a buried etch stop layer instead of the buried insulator. The etch stop could be a highly doped region of substrate material. In these situations, the active layer could include epitaxial silicon. The SOI wafer 301 can include a trap rich layer below the buried insulator. As with the SOI device described in the background section above, active layer 300 can include an interconnect layer in addition to the actual activated semiconductor material that is used for the channels of the FETs formed in the semiconductor device. Active layer 300 may also include additional layers of passivation and insulation used to protect the active layer.

Method 200 can then continue with either step 202 or 203. In step 202, a second wafer 306 is bound to the active layer side 303 of the SOI wafer 301. As shown in FIG. 3a, the second wafer could either be a temporary handle wafer or an RF component wafer. The bonding is illustrated by the downward arrows in FIG. 3a drawn between the sets of SOI wafer 301 and second wafer 306. The bonding method used can be any kind of wafer bonding process used in the industry such as a direct oxide-oxide bond (fusion bond), an adhesive bond, an anodic bond, a low-temperature glass frit bond, a molecular bond, an electrostatic bond, a metal-to-metal bond, etc. In step 203, a shield layer 307 is formed for the semiconductor device. The shield layer comprises an electrically conductive material. In situations where method 200 proceeds with step 203 before moving on to step 202, the shield layer can be used in the bonding process. For example, if the bonding process of step 203 was a metal-to-metal bond, the shield layer could provide a portion of the metal necessary for the bond.

Method 200 can then continue with step 204 in which the RF FET is coupled to a circuit comprising an RF component. The RF component will be in either the RF wafer that served as the second wafer 306 in step 202 or it can be a third wafer 308 that is bound to the SOI wafer 301 after a handle wafer is bound to the SOI wafer in step 202. In situations where the RF component wafer is bonded to the SOI wafer in step 202, the resulting structure is one in which the shield layer is on the active layer side of the SOI wafer. In contrast, in situations where a handle wafer is bonded to the SOI wafer in step 202, the resulting structure is one in which the shield layer is on the buried insulator side of the SOI wafer. Another difference between these two approaches is that in one, the original SOI substrate 305 is removed after the RF FET is electrically coupled to the circuit in the RF component wafer, while in the other the handle wafer substrate 306 is removed. The removal of this material is illustrated in FIG. 3a by the upward facing arrows that are directed to active layer side 303 and buried insulator side 302. Different integration techniques that can produce the devices illustrated in FIG. 3a are discussed in more detail below.

Method 200 can continue with step 205 in which the RF FET, the RF component, and the shield layer are all singulated into a die. The resulting semiconductor device comprises an integrated RF FET and RF component where the substrate used for the RF component is prevented from creating nonlinearities in the bias voltages and RF voltages applied to and operated on by the RF FET. Examples of RF components were provided above, but more specific examples that particularly benefit from the approaches described with reference to FIG. 2 include SAW, BAW, and FBAR filters.

The shielding layer provides a beneficial effect in any approach described above. However, the shielding layer also introduces a certain degree of parasitic capacitance to the system which in some cases will result in energy being shunted to ground and a less efficient RF device. Placing the shielding layer further away from the RF FET helps to alleviate this deleterious side effect. As illustrated in FIG. 3a, certain benefits accrue to the approaches in which the RF component wafer is bound to the active layer side 303 of the SOI wafer. As the buried insulator in certain SOI wafers is very thin—on the order of 10s of nanometers—and the active layer can include relatively thick layers of metallization and passivation, there is more distance provided between the RF component and the RF devices when the RF component wafer is bound to the active layer side of the SOI wafer. Since the RF FETs are formed at the interface of the buried insulator and the active layer, the entire remaining thickness of the active layer is between the RF component and RF switch in these situations as compared to the relatively thin buried insulator.

Shield Layer

The shield layer comprises an electrically conductive material and serves to screen or guard the RF FET from electromagnetic interference caused by the interaction of the bias and RF voltages with the substrate of the RF component wafer. The bias and RF voltages have both relatively large amplitude swings and frequencies which make them particularly problematic from the perspective of preventing or mitigating the effects of electromagnetic interference. However, the shield layer serves to provide an alternative path for energy signals that would otherwise have deleteriously interacted with the substrate of the RF component wafer substrate. The shield layer is electrically insulated from the RF FET, and optionally may be electrically insulated from the entire active layer of the SOI wafer in which the RF FET is formed.

The shield layer can comprise various materials and can be formed at various stages within the process of fabricating the semiconductor device. The choice of materials will be affected by the point at which the layer is formed. Generally, the shield layer can be made of any electrically conductive material. The shield layer can be a pure metal such as copper, tungsten, or molybdenum; a metal alloy such as titanium nitride; a metal silicide such as tungsten silicide; or a doped semiconductor such as silicon.

The shield layer can be formed in the interconnect metallization of the SOI wafer. The interconnect layer of the SOI wafer can generally be used to form the shield layer in any situation in which the top side of the SOI wafer is bound to the RF component wafer because the interconnect metallization is above the active layer in which the RF switches are formed. In approaches in which the RF component is formed in a separate wafer, the shield layer could also be formed in the interconnect metallization of the RF component wafer. The layer of metallization in the interconnect layer used to produce the shield layer could be the top metal for the process under which the wafer was fabricated. Generally, when the RF component in the final device is on the active layer side of the SOI wafer, the shield layer can be formed while the wafer is being processed anywhere in the SOI wafer above the RF switches. The aforementioned portions of the process are commonly referred to as the middle of the line or back end of the line portions of a semiconductor manufacturing process.

The shield layer can be formed by a layer of material deposited on a surface of the SOI wafer. For example, the shield layer could comprise a layer of conductive material deposited on the buried insulator side of the SOI wafer. In these approaches, the shield layer could serve as a base layer for the formation of the RF component on the SOI wafer through the deposition of various materials on the SOI wafer as described below. As another example, the shield layer could comprise a layer of conductive material deposited over the active layer side of the SOI wafer. In these approaches, the active layer side of the SOI wafer would need to be covered by some kind of insulator or passivation prior to the formation of the shield layer to prevent shorts from being formed between the interconnect metallization of the SOI wafer. In approaches in which the RF component is formed in a separate wafer, the shield layer could also be formed by a layer of material deposited on a surface of the RF component wafer. As another example, the shield layer could be formed through the use of post-layer-transfer metallization on the buried insulator side of the SOI wafer. This approach would be particularly amenable to situations in which signals were routed using post-layer-transfer metallization because the additional processing steps needed to form the shield layer would be negligible.

The shield layer could be utilized in the bonding process. For example, the shield layer could be a metal and provide a contact surface for a metal-to-metal bond between two wafers. To this end, the shield layer could also be formed through the deposition of a layer of conductive material on both wafers prior to bonding such that the final shield layer for the device was a fused combination of both of those layers.

The shield layer can take on various patterns. For example, the shield layer does not have to be a solid layer and may include pores at irregular or regular locations. These patterns can advantageously reduce the parasitic capacitance of the shield layer while at the same time maintaining the efficacy of the shield layer in terms of its ability to screen the substrate of the RF component from electromagnetic energy. For example, the shield layer could comprise a mesh having evenly spaced pores of circular or quadrilateral shape. The quadrilateral pores could be formed by intersecting strips of metallization laid out as a grid. In addition, the shield layer can include gaps for electrical conduits to pass through the shielding layer. Since the shield layer is used to shield the RF switch from the substrate of the RF component, but the shield layer is only needed because those two circuit elements are integrated, the shield layer would not be as useful if it prevented electrical connection between those elements. However, to balance the efficacy of the shield layer against the allowance for electrical conduits to connect circuit elements on either side of the shield, the gaps for the conduits can be designed to fit within a predetermined pattern of the shield layer. For example, the conduits could be formed through the pores of the shield layer that were already in use for limiting the parasitic capacitance of the shield layer. As another example, the conduits could be formed in a pattern that was removed from the immediate vicinity of the RF switch. The RF switch could be located in a central portion of the SOI wafer while the conduit was aligned over a periphery of the SOI wafer.

FIG. 4 illustrates shield layers 400 and 401 having shield layers used to screen electromagnetic waves 402. Shield layer 400 exhibits a pattern of evenly spaced circular pores 403. Shield layer 401 exhibits a pattern of evenly spaced square pores 404. The regularity of the pattern is not essential and is only included for illustrative purposes. The pore size of the circular pores 403 is set by the radius of the pores. The pore size of the square pores 404 is set by the diagonal of the square. As mentioned previously, the efficacy of the shield layer can be maintained while decreasing the parasitic capacitance of the shield layer by controlling the size and pattern of the pores.

The efficacy of the shield layer in relation to the pore size is set by the frequency of the electromagnetic interference that is being shielded. In turn, the frequency of the electromagnetic interference is set by the frequency of the bias voltages and RF signals voltages that the RF switch is operating on. At typical RF frequencies in the GHz range, pores with pore sizes on the order of microns can reduce parasitic capacitance while still effectively screening the substrate from electromagnetic energy. In the context of electromagnetic interference propagating through a semiconductor device, wavelength can be expressed according to the following equation:

$$\lambda = \frac{c}{nf}$$

In this equation, $\lambda$ is wavelength, c is the speed of light, n is the refractive index of the material that is propagating the signal, and f is the frequency. The relative refractive index of silicon dioxide is about 3.9. So the wavelength of a 1 GHz wave in silicon dioxide is about 7.5 cm. The attenuation provided by an aperture is calculated from the following equation:

$$A = 20 \log_{10}\left(\frac{\lambda}{2s}\right)$$

In this equation, A is attenuation, $\lambda$ is wavelength, and the aperture size is s. According to this equation, the attenuation of an opening that is 1/10 the wavelength of the signal that is being attenuated is 14 decibels. An opening that is 1/1000 the wavelength of the signal that is being attenuated provides an attenuation of 54 decibels. Thus a 7.5 µm opening compared to a 7.5 cm wavelength gives an attenuation of 54 decibels. Thus the required attenuation can be used to determine the maximum pore size allowable for the shield layer pattern. In general, a ratio of 10% between the wavelength and size of the pores in the shielding layer will provide a suitable figure of merit for most RF applications. However, the exact ratio depends on the requirements for the overall RF system to which the semiconductor device is a part.

The efficacy of the shield layer can also be enhanced by introducing an active bias to the shield layer. Although the shield layer can be biased by a set voltage, certain benefits accrue to approaches in which the shield is driven by the same large signal potential as the RF switch. To this end, the methods of fabricating a semiconductor device disclosed previously could be augmented by the step of coupling the shield layer to a circuit comprising an active bias voltage generator. The active bias voltage generator could provide a bias voltage to the shield layer that tracks the large signal bias signal provided to the RF switch. If the bias voltages applied to the RF switch and the shield layer are kept in phase, the parasitic capacitance between the shield layer and the RF switch would be eliminated. As a result, any non-linearities created between the shield layer and the RF component substrate would still be shunted harmlessly to ground, but there would be no increase in parasitic capacitance for the RF switch. Indeed, in some instances the use of a driven shield could reduce the total parasitic capacitance in the semiconductor device relative to one in which no shield layer was introduced.

Integration Techniques

Figure 2:
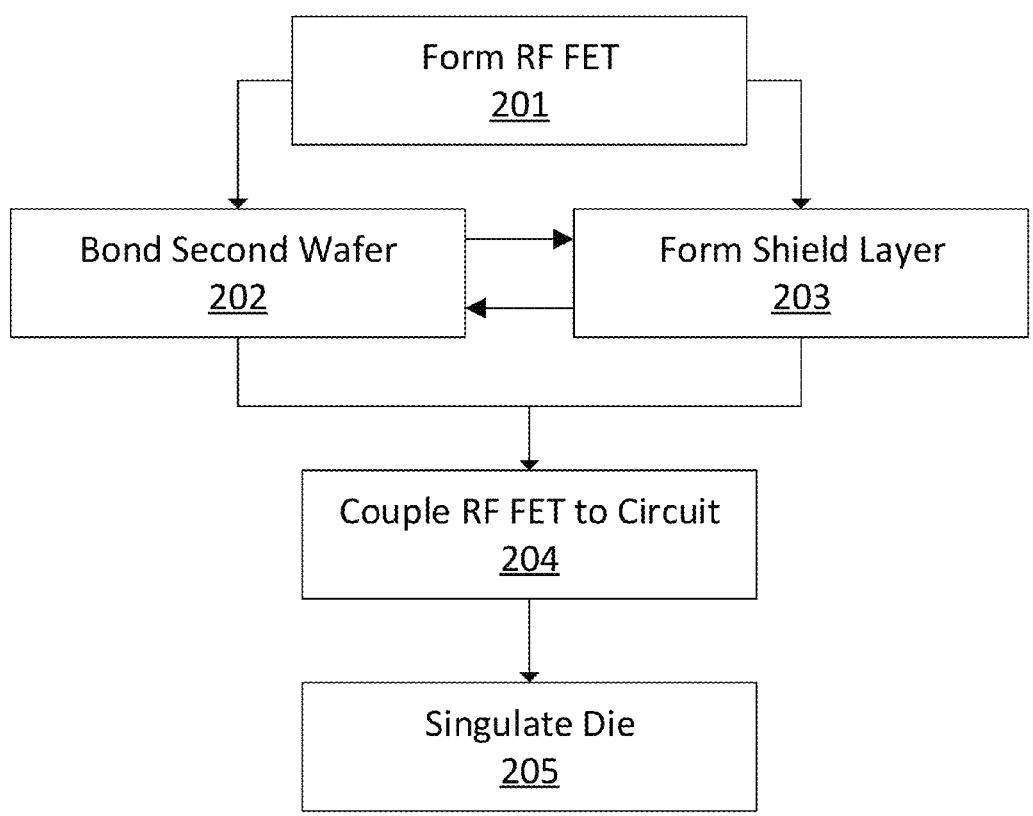
FIG. 2 illustrates a flow chart of methods for forming a semiconductor device with a shield layer in accordance with an embodiment of the present invention.
Figure 3A:
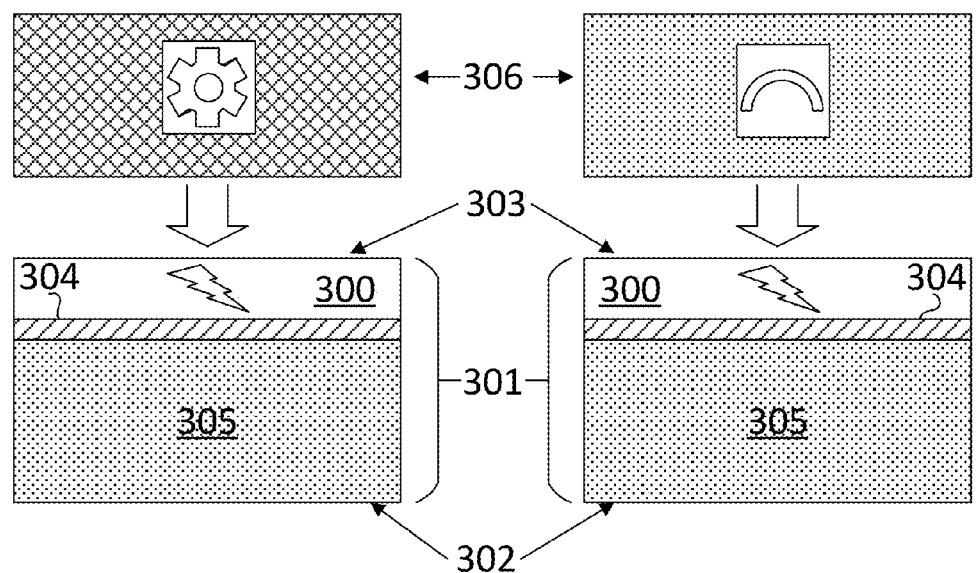
FIGS. 3a and 3b illustrate a block diagram cross section of semiconductor devices at various stages of production in accordance with specific methods from FIG. 2 in accordance with an embodiment of the present invention.
Figure 3B:
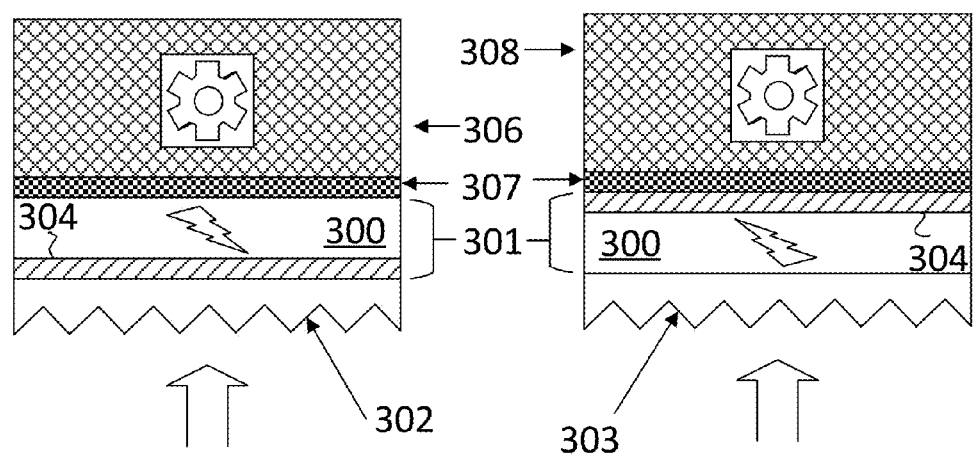
Figure 5:
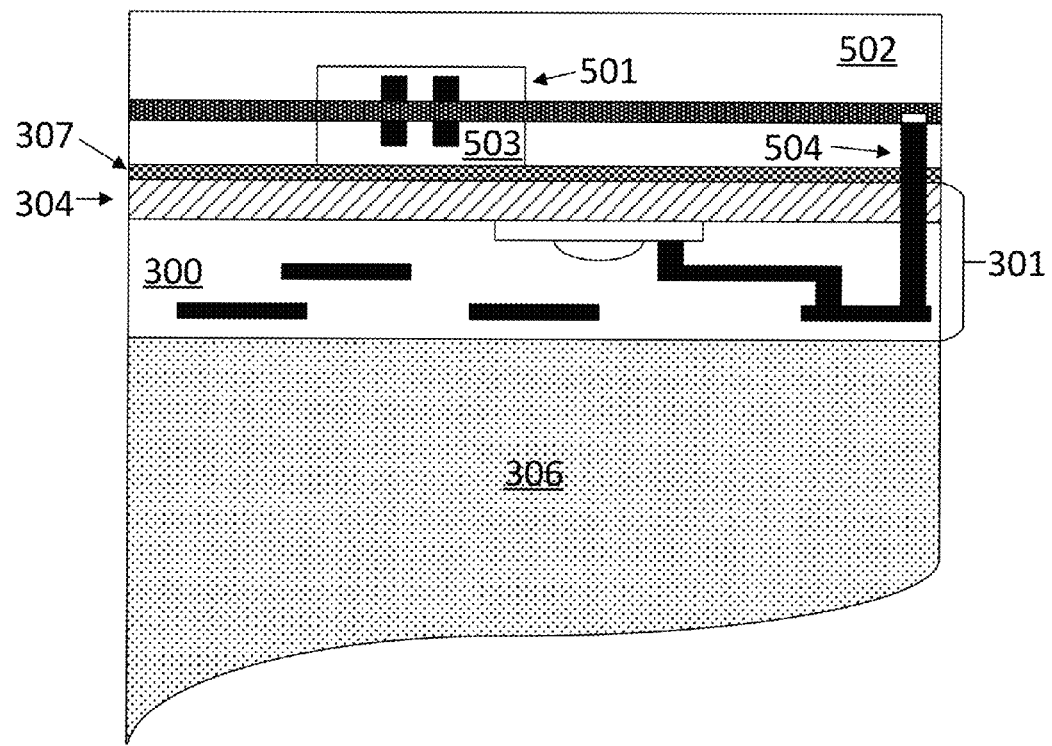
FIG. 5 illustrates a block diagram cross section of a semiconductor device fabricated in accordance with specific methods from FIG. 6 in accordance with an embodiment of the present invention.
Figure 6:
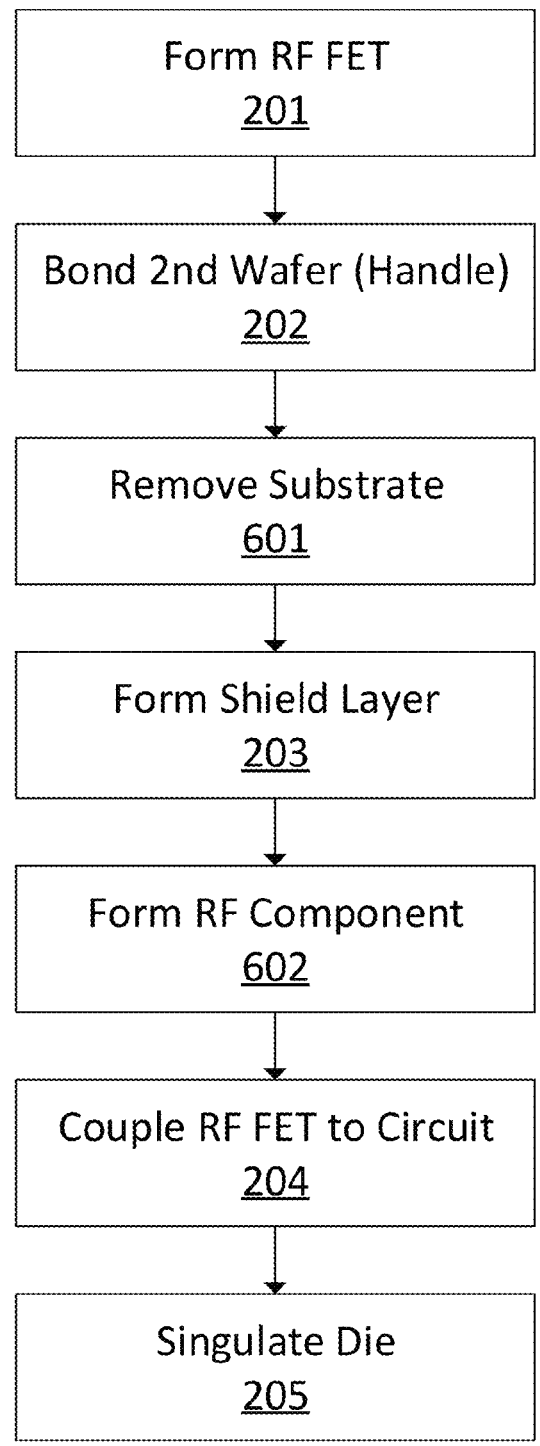
FIG. 6 illustrates a flow chart of methods for forming a semiconductor device with a shield layer and an integrated RF component built on the buried insulator side of a layer transferred wafer in accordance with an embodiment of the present invention.
Figure 7:
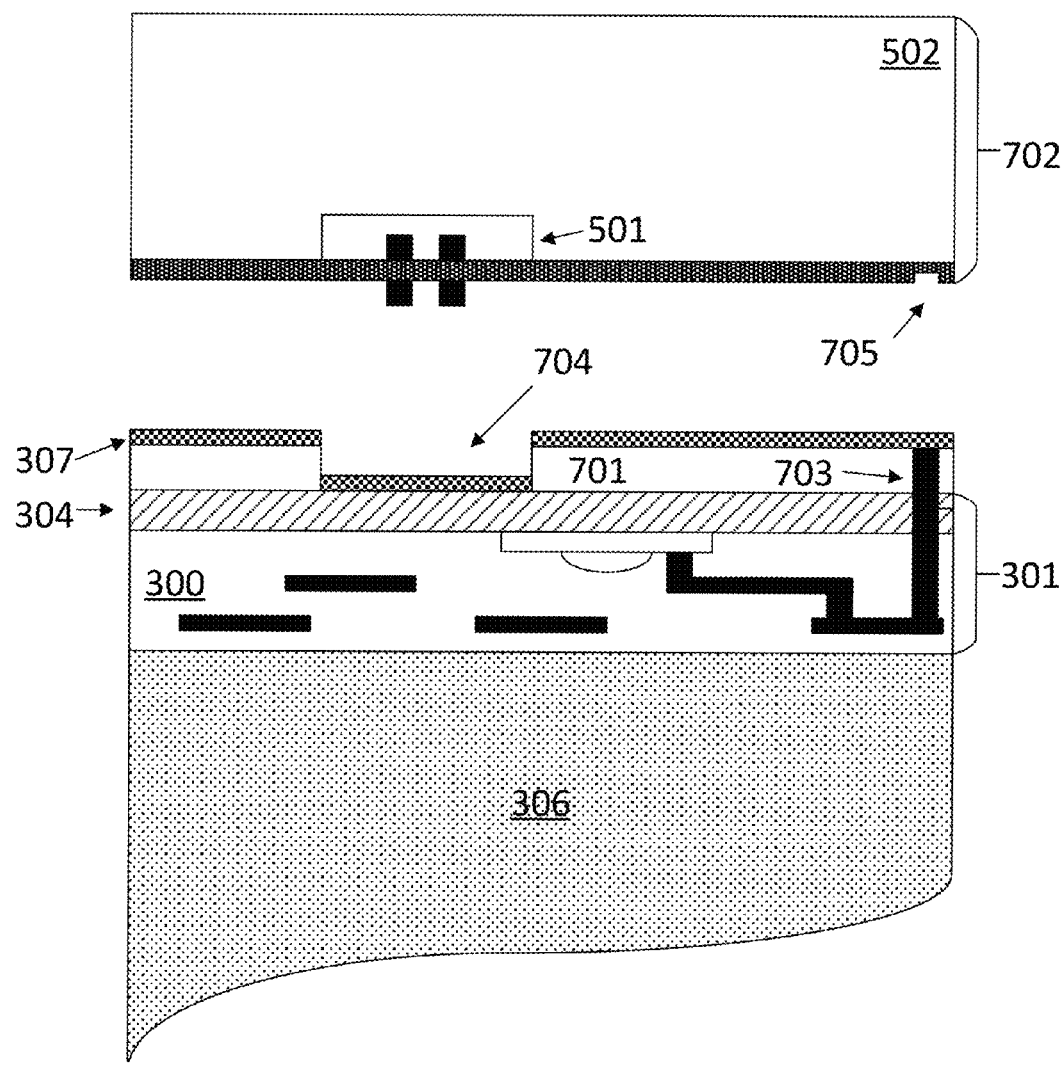
FIG. 7 illustrates a block diagram cross section of a semiconductor device that is being fabricated in accordance with specific methods from FIG. 8 in accordance with an embodiment of the present invention.
Figure 8:
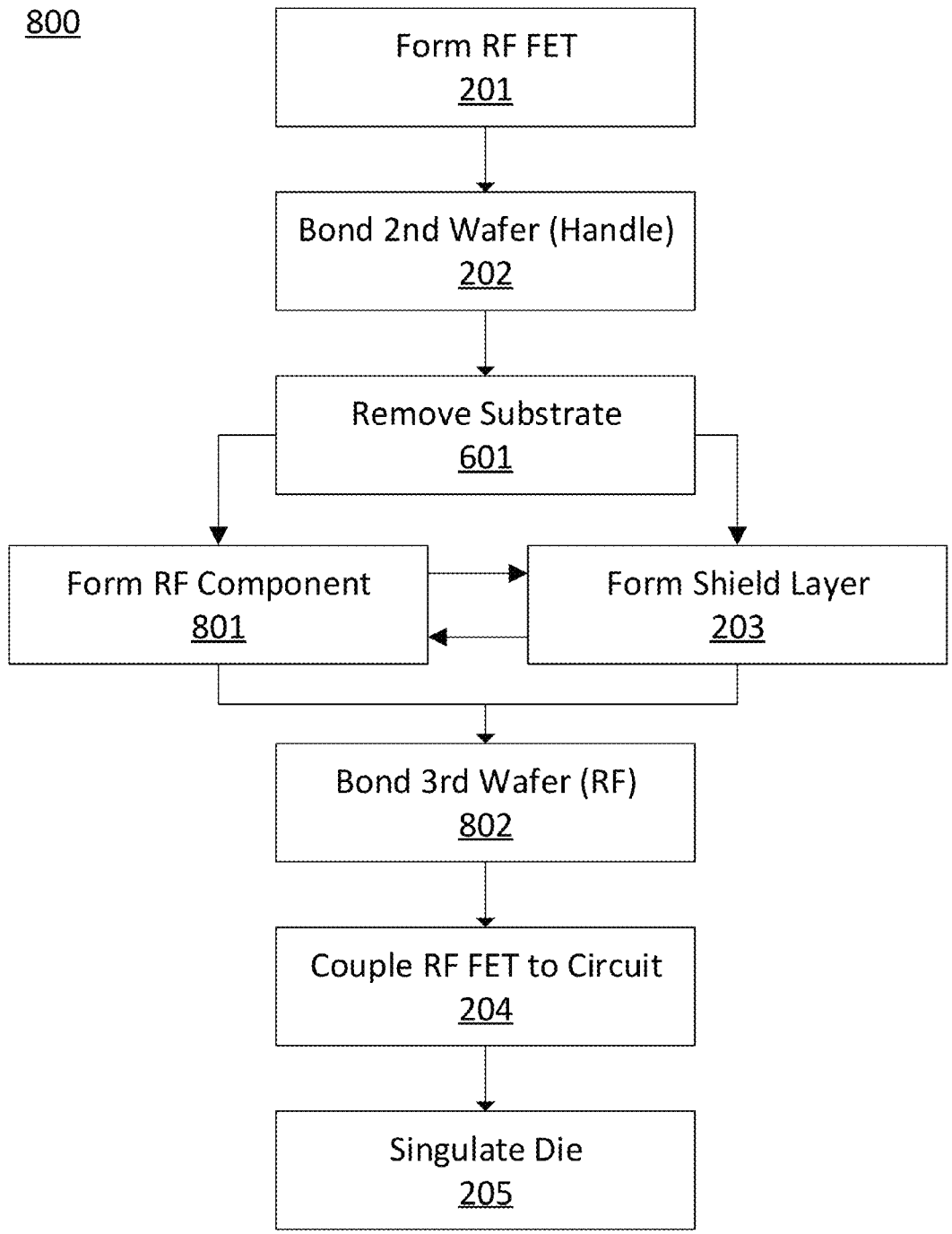
FIG. 8 illustrates a flow chart of methods for forming a semiconductor device with a shield layer and an integrated RF component built on the buried insulator side of a layer transferred wafer in accordance with an embodiment of the present invention.
Figure 9:
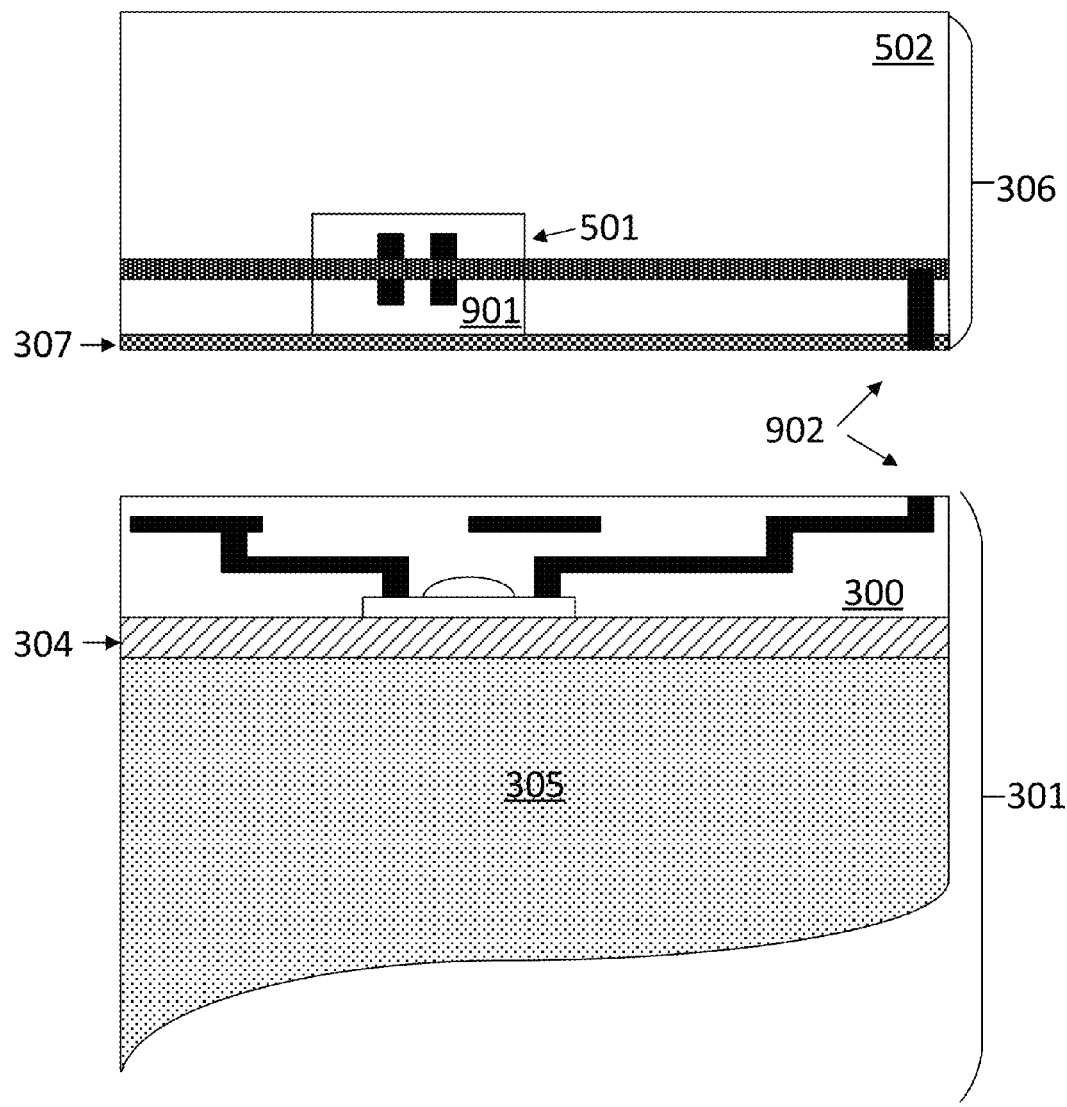
FIG. 9 illustrates a block diagram cross section of a semiconductor device that is being fabricated in accordance with specific methods from FIG. 10 in accordance with an embodiment of the present invention.

Various integration techniques can be applied in combination with the methods discuss with reference to FIG. 2 and FIGS. 3a-b. A few of these techniques can be described with reference to FIGS. 5-10. These specific approaches do not encompass the full extent of this disclosure. In particular, the block diagrams of semiconductor devices in FIGS. 5, 7, and 9 are directed to the integration of an acoustic filter with an RF switch, but the integration techniques of this disclosure can be applied to the integration of any RF component with an RF switch.

A specific approach for integrating an RF switch with an RF component in a semiconductor device can be described with reference to device cross section 500 in FIG. 5 and the flow chart of method 600 in FIG. 6. Method 600 includes many of the steps described with reference to FIG. 2 and the related disclosures for method 200 are in large part applicable to method 600. However, as drawn, method 600 executes the bonding of the second wafer in step 202 prior to the formation of shield layer in step 203. With reference to cross section 500, the second wafer that is bonded to the SOI wafer is handle wafer 306. Handle wafer 306 is bonded to the active layer side of the SOI wafer. The handle wafer can include a trap rich layer as disclosed in U.S. patent application Ser. No. 14/454,370, filed Aug. 7, 2014, the disclosure of which is incorporated by reference herein in its entirety. After this step, the SOI wafer is inverted and the substrate of the SOI wafer is at least partially removed through a chemical etch or grinding process in step 601. The resulting structure is illustrated in cross section 500. Since the active layer and buried insulator have been transferred from their previous substrate to the handle wafer—which effectively serves as a new substrate—the SOI wafer can now be more specifically referred to as a layer transferred wafer. At this point, layer transferred wafer 501 is bonded on its active layer side to handle wafer 306, and portions of the buried insulator layer 304 may be exposed.

Method 600 continues with the construction of a shield layer and integrated RF component on the buried insulator side of the layer transferred wafer. The shield layer can be deposited on the buried insulator side of the layer transferred wafer or it can be formed through other means. As illustrated in FIG. 5, shield layer 307 covers the back side of layer transferred wafer 301. However, the shield layer may only cover a portion of the wafer. Also, shield layer 307 in FIG. 5 is formed directly on the buried insulator layer 304. However, the shield layer can also be formed on a remaining portion of the original substrate layer for the SOI wafer or an additional dielectric layer can be deposited on the buried insulator side of the SOI wafer before the shielding layer.

Method 600 continues with the formation of an integrated RF component on the buried insulator side of the layer transferred wafer in step 602. As drawn, the RF component 501 is an FBAR acoustic filter which includes a substrate 502 and a cavity 503. However, the RF component can be any of those RF components mentioned previously. The RF component can be conducted through the deposition, etching, grinding, diffusion, and doping of multiple material layers on the buried insulator side of the layer transferred wafer. The handle wafer 306 will provide the required stability needed to support this process.

Certain benefits accrue to situations in which the RF component that is constructed in step 602 is built using a low temperature process as this will prevent unwanted modifications to the layer transferred wafer. In particular, if the layer transferred wafer includes a trap rich layer, low temperature processing may maintain the efficacy of the trap rich layer by preventing the traps from being annealed out of the trap rich layer. For purposes of this disclosure a low temperature process is one which does not exceed 400° C.

A specific approach for integrating an RF switch with an RF component in a semiconductor device can be described with reference to device cross section 700 in FIG. 7 and the flow chart of method 800 in FIG. 8. Method 800 begins with steps 202 and 201 that are in keeping with steps 201 and 202 as described with reference to method 600 above. Again, active layer 300 and buried insulator 304 comprise a layer transferred wafer 301 with a handle wafer that was bonded in step 202, and the handle wafer can include a trap rich layer as disclosed in U.S. patent application Ser. No. 14/454,370, filed Aug. 7, 2014. Method 800 continues with step 601 in which at least a portion of the SOI substrate is removed. In contrast to cross section 500, cross section 700 illustrates a remaining portion 701 of the SOI substrate. However, method 800 is not limited to an approach in which only a portion of the SOI substrate has been removed, as the entire substrate can also be removed.

Method 800 continues with either step 801, in which a radio frequency component is formed in a third wafer 702, or step 203, in which a shield layer is formed for the semiconductor device as described above. In cross section 700, third wafer 702 comprises an acoustic device 501. However, third wafer 702 could comprise and RF component instead. Method 800 can be executed in either order because shield layer 307 may be deposited over the third wafer after the RF component is formed in the third wafer, or the shield layer may be formed on the layer transferred wafer, in which case the relative execution of steps 801 and 203 is not as important. The shield layer could comprise a layer of conductive material formed on the third wafer before bonding the third wafer to the buried insulator side of the SOI wafer. In that case, step 703 would need to be conducted prior to step 203. As illustrated, shield layer 307 has been formed on the layer transferred wafer 301 so the formation of acoustic device 501 could have been executed before or after the formation of shield layer 307.

Method 800 continues with step 802 in which a third wafer is bonded to the buried insulator side of the SOI wafer after removing the portion of the substrate in step 601. As a result, a remaining portion of the SOI substrate, such as portion 701, may lie between the third wafer and the layer transferred wafer 301. The remaining portion of the substrate may be a highly doped etch stop region of the substrate. However, step 802 is not limited to the cross section 700 and the entire SOI substrate can be removed before the third wafer is bonded to the layer transferred wafer in step 802. The wafers can be bonded using any of the approaches described above with respect to step 202. In particular, and as mentioned previously, the shield layer may be partially formed on surfaces of both the layer transferred wafer and the third wafer 702 prior to bonding such that the shield layer is utilized in a metal-to-metal bond for the two wafers. Although the bond interface will be discussed below, in situations where electrical contacts or acoustic device cavities need to be aligned, the bonding process may be slightly more expensive than those in which no precise alignment is required. As illustrated, cavity 704 that is formed in the substrate of the SOI wafer will need to be aligned with the acoustic device 501.

Method 800 then continues with steps 204 and 205 as described above. In method 800, the coupling step in 204 can be conducted as part of step 802 in that contacts for the two wafers can be aligned and an electrical connection can be formed as soon as the wafers are brought into contact. In the alternative, TSVs or other contacts may need to be formed by etching through the RF component substrate 502 of the active layer 300 after the wafers have been bonded.

Figure 10:
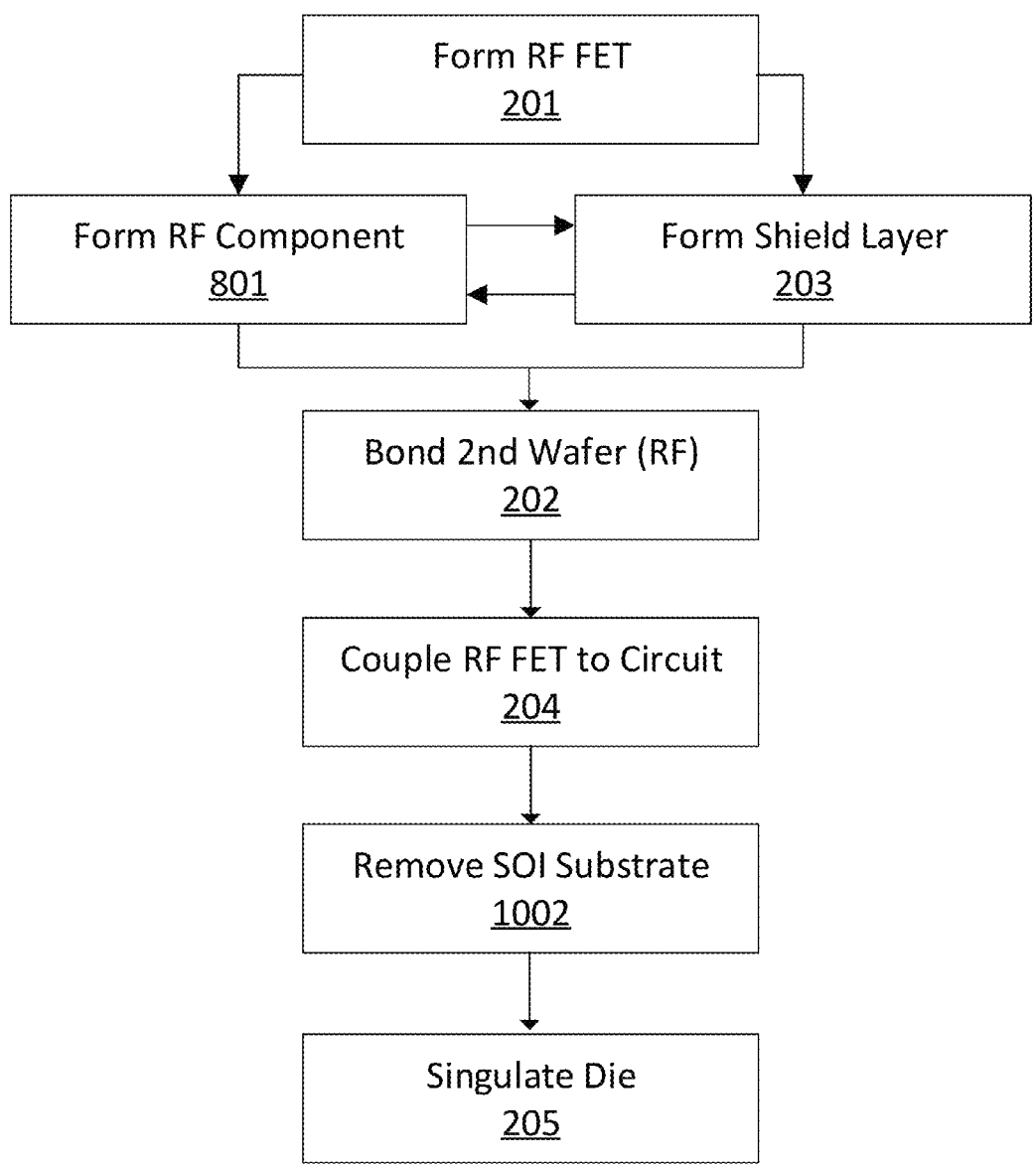
FIG. 10 illustrates a flow chart of methods for forming a semiconductor device with a shield layer and an integrated RF component built on the buried insulator side of a layer transferred wafer in accordance with an embodiment of the present invention.

A specific approach for integrating an RF switch with an RF component in a semiconductor device can be described with reference to device cross section 900 in FIG. 9 and the flow chart of method 1000 in FIG. 10. Method 1000 proceeds in a similar fashion to method 800 except for two main differences. First, SOI substrate 305 is not removed prior to the execution of step 202. Second, the second wafer—which in the illustrated case is RF component wafer 306—is bonded to the active layer side of SOI wafer 301 instead of the buried insulator side. As a result, the bond between the RF component wafer and the SOI wafer is formed before active layer 300 is layer transferred, and the RF component wafer 306 can effectively serve as the handle wafer for creating the layer transferred active layer.

Step 202 in method 1000 is executed by bonding the RF component wafer 306 to the active layer side of the SOI wafer 301. This bond can be conducted through the use of a bond layer deposited on the active layer side of the SOI wafer 301. The bond layer can comprise a portion of the shield layer 307. The shield layer can also be formed solely on the RF component wafer or it can be formed on both surfaces to facilitate a metal-to-metal bond for step 202. However, the shield layer can also take on any form as described above such that the shield layer would not be involved with the bonding step. As illustrated, shield layer 307 comprises a layer of conductive material formed on the RF component wafer 306 prior to bonding it to SOI wafer 301. Method 1000 can also include an additional step 1002 in which the SOI substrate 305 is removed after the SOI wafer 301 is bonded to the RF component wafer 306. It is during this step that the RF component wafer 306 would serve as the handle wafer for the layer transferred active layer.

Interface Characteristics

The interface between the RF component wafer and the layer transferred wafer can take on various characteristics. The interface can also exhibit various characteristics in situations where the RF component is built on the layer transferred wafer. In particular, the interface can include contacts for conductive conduits that couple the RF FET with the RF component. In situations where the RF component is an acoustic device, the interface can also include cavities for the acoustic device. These cavities can be formed in a remaining portion of a removed substrate after a portion of the substrate is removed. In situations where the shield layer is located at the interface, the shield layer can also take on various characteristics based on its involvement in the bonding process, the presence of electrical contacts through the interface, and the presence of cavities at the interface for any acoustic devices that may be in the system.

In the approaches discussed with reference to FIG. 5, the step of coupling the RF FET to a circuit that includes the RF component in step 204 of method 600 can be conducted in various ways. In one approach, part of step 201 in method 600 will involve the creation of a TSV contact 504 that is created from the active layer side of SOI wafer 301 prior to the bonding of handle wafer 306. The TSV can terminate at a bonding pad located in the buried insulator layer 304 or on a top or bottom surface of the buried insulator layer. Regardless of where the TSV terminates, an electrical connection can be made to the RF component 501 as the component is built up. These approaches may require the shield layer 307 and the buried insulator 304 to be etched to expose the TSV. This etching can take place from the buried insulator side of the layer transferred wafer. Shield layer 304 can be formed around the contact in step 203 or it can be etched through from the buried insulator side after step 203 to form the contact for step 602. The etching from the buried insulator side or the active layer side can be accompanied by the deposition of a conductive material into a region excavated during the etch such as an excavated region of the buried insulator that is formed when the buried insulator is etched. Since the RF FET will be coupled to the circuit with the RF component via this contact, the shield layer will need to be isolated from the contact by either having the conduit pass through the pores of the shield layer or having the conduit pass through a region of the device that is outside the lateral scope of the shield layer. The pore through which the conduit passes through the shield layer can be ringed with insulator to prevent contact between the conduit and the shield layer.

In the approaches described with reference to FIG. 7, coupling the RF FET to a circuit that includes the RF component in step 204 of method 800 can be conducted in various ways. In contrast to the approaches discussed with reference to FIG. 7, RF component wafer 702 may also need to be prepared to form an electrical contact prior to bonding. The bonding surface of the RF component wafer 702 can be processed to include a contact pad 705 for coupling with conduit 703. Also, if the shield layer is formed on either wafer, the shield may need to be etched to expose the contact, or deposited in a pattern that avoids the contacts as described above with reference to FIG. 5. Conduit 703 can be formed via processing from the buried insulator side, processing from the active layer side, or a combination of both as described with reference to conduit 504.

As illustrated in FIG. 7, the conduit may also need to extent through a remaining layer of SOI substrate 701 in situations where a cavity 704 was formed while removing a portion of the SOI substrate. This portion of the conduit may be formed from the buried insulator side of the SOI wafer 301 and connect to a TSV that was formed previously from the active layer side of the SOI wafer 301. However, both portions of the conduit could be formed from the buried insulator side of the SOI wafer 301, and could contact landing pads formed in the active layer 300.

The wafer bonding that is conducted in step 802 may need to align features of the RF component wafer 702 and the SOI wafer 301. In particular, if a portion of a cavity for an acoustic device is formed in the substrate of SOI wafer 301, then that portion will need to be aligned with the RF component 501 in the RF component wafer 702. In addition, if both wafers have been processed to provide electrical contact pads, the pads will need to be aligned to assure that the RF switch is coupled to the circuit in RF component wafer 702. Alignment requirements can be somewhat alleviated if large contact pads are utilized. To avoid taking up too much real estate on the interface, the contact pads could be formed in active layer 300 and within substrate 502 and the contact could be formed after the wafers are bonded via the back side of the RF component wafer.

In the approaches described with reference to FIG. 9, coupling the RF FET to a circuit that includes the RF component in step 204 of method 1000 can be conducted in various ways. Pre-bond processing of the RF component wafer 306 can proceed according to any of the approaches described with reference to FIG. 7. However, the same approaches utilized for SOI wafer 301 will generally not apply because contacts need to be made from the active layer side of the insulator. Fortunately, this kind of contact is easier to manage as the buried insulator does not need to be etched, and contacts can be formed as part of the interconnect layer of active layer 300 or can be RDL material formed on top of the active layer. As illustrated, the shield layer 307 has been formed entirely on the surface of the RF component wafer, and contact will be made through contacts 902. Regardless of which wafer the shield layer is formed on, the shield layer pattern will need to be outside the lateral scope of the conduit, or the conduit will need to pass through a pore in the shield layer as described above.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A method for forming a semiconductor device comprising:
    forming a radio frequency field effect transistor in an active layer of a semiconductor on insulator wafer, wherein the semiconductor on insulator wafer has a buried insulator side and an active layer side;
    bonding a second wafer to the active layer side of the semiconductor on insulator wafer;
    removing a substrate of the semiconductor on insulator wafer to expose surface of a buried insulator layer of the semiconductor on insulator wafer;
    forming a shield layer for the semiconductor device to completely cover the exposed surface of the buried insulator layer, wherein the shield layer comprises an electrically conductive material;
    coupling the radio frequency field effect transistor to a circuit comprising a radio frequency component; and
    singulating the radio frequency field effect transistor, the radio frequency component, and the shield layer into a die.

2. The method of claim 1, further comprising:
    forming the radio frequency component on the buried insulator side of the semiconductor on insulator wafer after removing the substrate.

3. A method for forming a semiconductor device, comprising:

forming a radio frequency field effect transistor in an active layer of a semiconductor on insulator wafer, wherein the semiconductor on insulator wafer has a buried insulator side and an active layer side;

bonding a second wafer to the active layer side of the semiconductor on insulator wafer;

removing at least a portion of a substrate of the semiconductor on insulator wafer to expose at least a portion of a buried insulator layer of the semiconductor on insulator wafer;

forming a radio frequency component in a third wafer prior to bonding the third wafer to the buried insulator side of the semiconductor on insulator wafer after removing the portion of the substrate;

coupling the radio frequency field effect transistor to a circuit comprising the radio frequency component;

forming a shield layer for the semiconductor device on at least the exposed portion of the buried insulator layer, wherein the shield layer comprises an electrically conductive material; and singulating the radio frequency field effect transistor, the radio frequency component, and the shield layer into a die.

4. The method of claim 3, further comprising:

forming a radio frequency component cavity while removing the portion of the substrate;

wherein the radio frequency component utilizes the radio frequency component cavity; and wherein the radio frequency component is an acoustic filter.

5. The method of claim 1, further comprising:

coupling the shield layer to a second circuit comprising an active bias voltage generator;

wherein the active bias voltage generator provides a bias voltage to the shield layer that tracks a large signal bias signal provided to the radio frequency field effect transistor.

6. A method for forming a semiconductor device comprising:

forming a radio frequency field effect transistor in an active layer of a semiconductor on insulator wafer, wherein the semiconductor on insulator wafer has a buried insulator side and an active layer side;

bonding a second wafer to the active layer side of the semiconductor on insulator wafer;

removing at least a portion of a substrate of the semiconductor on insulator wafer to expose at least a portion of a buried insulator layer of the semiconductor on insulator wafer;

forming a shield layer for the semiconductor device on at least the exposed portion of the buried insulator layer and a remaining portion of the substrate of the semiconductor on insulator wafer, wherein the shield layer comprises a conductive material;

forming a radio frequency component on the buried insulator side of the semiconductor on insulator wafer after removing the portion of the substrate;

coupling the radio frequency field effect transistor to a circuit comprising the radio frequency component; and singulating the radio frequency field effect transistor, the radio frequency component, and the shield layer into a die.

7. The method of claim 6, further comprising:

coupling the shield layer to a second circuit comprising an active bias voltage generator;

wherein the active bias voltage generator provides a bias voltage to the shield layer that tracks a large signal bias signal provided to the radio frequency field effect transistor.

8. The method of claim 6, wherein:

the radio frequency field effect transistor is coupled to the circuit via a metal conductor deposited in an excavated region of the buried insulator layer.

9. The method of claim 6, wherein:

the shield layer has a mesh pattern.

10. A method for forming a semiconductor device, comprising:

forming a radio frequency field effect transistor in an active layer of a semiconductor on insulator wafer, wherein the semiconductor on insulator wafer has a buried insulator side and an active layer side;

bonding a second wafer to the active layer side of the semiconductor on insulator wafer;

removing at least a portion of a substrate of the semiconductor on insulator wafer to expose at least a portion of a buried insulator layer of the semiconductor on insulator wafer;

forming a shield layer for the semiconductor device on at least the exposed portion of the buried insulator layer, wherein the shield layer comprises an electrically conductive material;

coupling the radio frequency field effect transistor to a circuit comprising a radio frequency component; and singulating the radio frequency field effect transistor, the radio frequency component, and the shield layer into a die, wherein the shield layer is formed on a remaining portion of the substrate of the semiconductor on insulator wafer.

11. The method of claim 6, wherein the shield layer is formed on a remaining portion of the substrate of the semiconductor on insulator wafer.

* * * * *